United States Patent [19]
Kaneshige et al.

[11] Patent Number: 5,876,223
[45] Date of Patent: Mar. 2, 1999

[54] CONNECTING TERMINAL FOR ELECTROMAGNETIC SHIELD

[75] Inventors: Akira Kaneshige, Musashino; Takashi Matsunaga, Tokyo; Masato Yamaguchi, Yokohama, all of Japan

[73] Assignees: Molex Incorporated, Lisle, Ill.; Sony Corporation, Tokyo, Japan

[21] Appl. No.: 685,283

[22] Filed: Jul. 23, 1996

[30] Foreign Application Priority Data

Jul. 27, 1995 [JP] Japan .................................... 7-211063

[51] Int. Cl.$^6$ ...................................................... H01R 9/00
[52] U.S. Cl. ......................... 439/108; 361/818; 361/753; 439/95
[58] Field of Search .............................. 439/76.1, 92, 95, 439/96, 108; 361/212, 220, 753, 816, 818; 174/35 R, 35 MS, 51

[56] References Cited

U.S. PATENT DOCUMENTS

| | | | |
|---|---|---|---|
| 5,055,971 | 10/1991 | Fudala et al. | 361/816 |
| 5,150,282 | 9/1992 | Tomura et al. | 361/424 |
| 5,181,318 | 1/1993 | Janota et al. | 361/816 |
| 5,205,739 | 4/1993 | Malo et al. | 439/66 |
| 5,235,492 | 8/1993 | Humbert et al. | 439/108 |
| 5,357,402 | 10/1994 | Anhalt | 174/51 |
| 5,397,857 | 3/1995 | Farquhar et al. | 361/753 |
| 5,428,508 | 6/1995 | Pronto | 361/818 |
| 5,522,602 | 6/1996 | Kaplo et al. | 174/35 MS |
| 5,557,507 | 9/1996 | Koike et al. | 361/816 |

FOREIGN PATENT DOCUMENTS

| | | | |
|---|---|---|---|
| 4039413A1 | 7/1991 | Germany | H01R 4/64 |
| 9407499U1 | 9/1995 | Germany | H01R 13/24 |
| WO 91/15939 | 10/1991 | WIPO | H05K 9/00 |

*Primary Examiner*—J. J. Swann
*Attorney, Agent, or Firm*—James C. Paschall

[57] ABSTRACT

An improved connecting terminal for an electromagnetic shield is provided for use with a printed circuit board. The printed circuit board is contained in a shielded casing having shielding walls to define compartments. The connecting terminal makes an electric connection between the ground pattern, the shielded inside and shielding walls of the shielded casing, thereby preventing an electromagnetic field from interfering with surrounding electric circuits. The connecting terminal comprises an elongated base strip having an undersurface to be soldered to a selected portion of the ground pattern and a pair of inwardly directed contact arms integrally connected to the opposite ends of the elongated base strip. Each contact arm makes contact with the shielded inside and shielding walls of the casing.

14 Claims, 7 Drawing Sheets

PRIOR ART

FIG. 15

PRIOR ART

FIG. 16

PRIOR ART

FIG. 17

PRIOR ART

CONNECTING TERMINAL FOR ELECTROMAGNETIC SHIELD

BACKGROUND OF THE INVENTION

The present invention relates generally to electromagnetic shielding for preventing interference on surrounding electric circuits or apparatus by an electromagnetic field. The present invention is more particularly related to a connecting terminal or member for connecting a ground pattern formed on a printed circuit board to an electromagnetic shield.

DESCRIPTION OF THE PRIOR ART

Electromagnetic fields are generated by a high-frequency oscillator which is mounted on a printed circuit board. The printed circuit board and the high-frequency oscillator are contained in a shielded casing to contain the electromagnetic field. For example, as is well known, portable telephones are equipped with means to prevent the electromagnetic field generated by the high-frequency oscillator from interfering with surrounding electric circuits.

Specifically, the high-frequency oscillator is formed on the printed circuit board and contained in a selected compartment of a casing on the printed circuit board. The compartment is defined by surrounding walls. By plating the inside of the casing and the walls with nickel or copper and electrically connecting them to the ground pattern of the printed circuit board, the inside of the casing and the walls function as electromagnetic barriers. The casing and the walls are electrically connected to the ground pattern by connecting terminals or members which are called "connecting terminals for electromagnetic shield."

Figure 14:
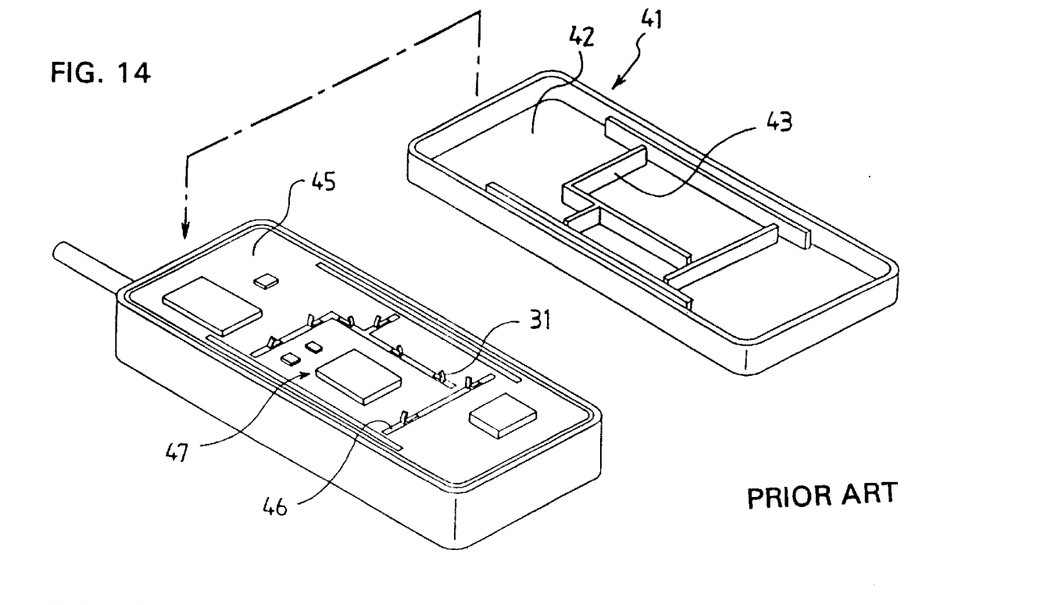
FIG. 14 is a perspective view of a printed circuit board casing in its opening condition, showing how conventional electric connecting terminals are used.
Figure 15:
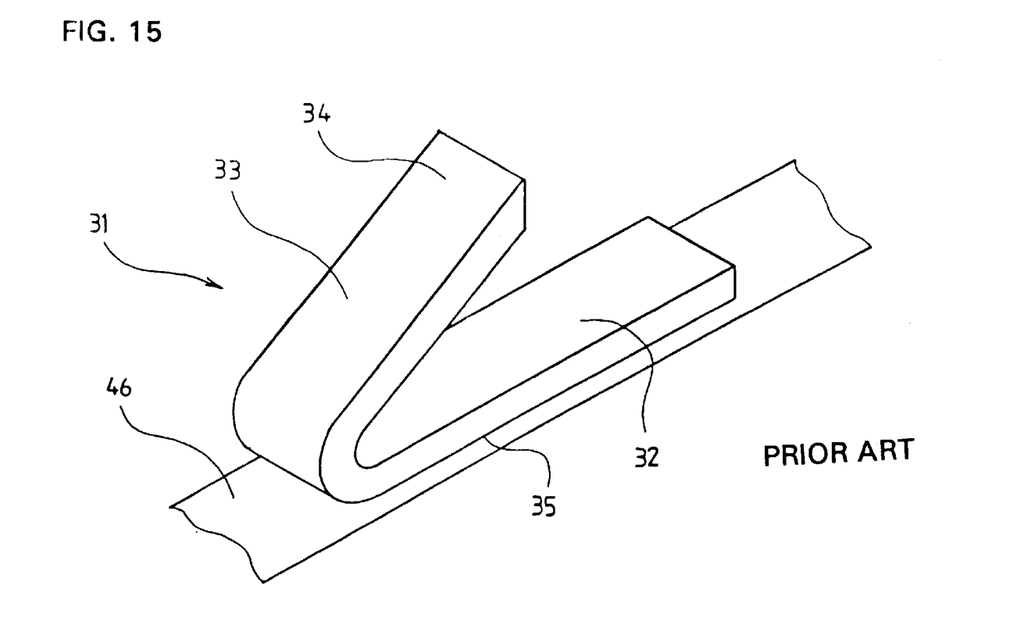
FIG. 15 is a perspective view of the conventional electric connecting terminal of the type shown in FIG. 14.

One example of such a connecting terminal for an electromagnetic shield is shown in FIGS. 14 and 15. A high-frequency oscillator 47 is contained in a selected compartment of a casing 41 defined by surrounding walls 43. An inside 42 of the casing 41 and surrounding walls 43 are plated with nickel or copper. The compartment is electrically connected to the ground pattern 46 of the printed circuit board 45. Necessary electric connections are made by connecting terminals 31. Each terminal 31 comprises a bent-metal strip with an extended base 32 and a contact arm 33 integrally connected to one end of the extended base 32. The extended base 32 is to be soldered to a selected portion of the ground pattern 46, thus allowing the contact arm 33 to contact the plated inside 42 of the casing 41. Sufficient-metal strips are prepared and soldered to selected portions of the ground pattern 46 of the printed circuit board 45.

Advantageously, this connecting terminal 31 is small, simple in shape and structure, and can be used irrespective of the size of the ground pattern. However, disadvantageously, the connecting terminal 31 has a contact arm on one end. Therefore, the center of gravity is not at the center of the elongated base 32 at which the connecting terminal 31 is to be soldered to a selected portion of the ground pattern 46. While soldering the connecting terminal 31 to the ground pattern 46, it can take an undesired or incorrect posture relative to the ground pattern due to the surface tension of soldering material. Also, the terminal 31 provides only a small space to which negative pressure can be applied for an automatic positioning device to suckingly hold the connecting terminal 31. Sometimes if the negative pressure is applied to the contact arm 33, it can become deformed while the connecting terminal is suckingly held during placement.

Figure 16:
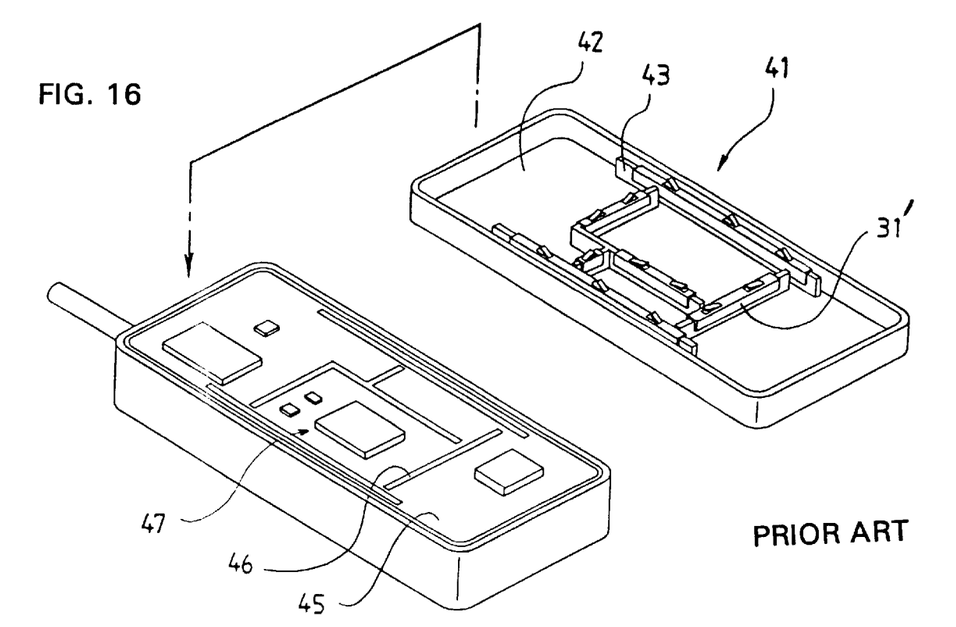
FIG. 16 is a perspective view of a printed circuit board casing in an open condition, showing how another conventional electric connecting terminal is used.

Another example of such a connecting terminal 31' is shown in FIGS. 16 an 17. The high-frequency oscillator 47 is mounted on the printed circuit board 45. The connecting terminal 31' comprises a U-shaped channel to receive the edge of the selected shielding wall 43, which stands upright form the shielded inside 42 of the casing 41. As seen from FIG. 17, the connecting terminal 31' mounts a selected shielding wall 43 with opposite sides 32' applied to corresponding opposite sides of the wall 43. The connecting terminal 31' has a plurality of contact arms 33' cut and bent up from a top surface for contacting selected portions of the ground pattern 46 on the printed circuit board 45. When the shielded top cover is applied to the casing 41, the contact arms 33' of the connecting terminal 31' will contact the ground pattern 46 of the printed circuit board 45.

Figure 17:
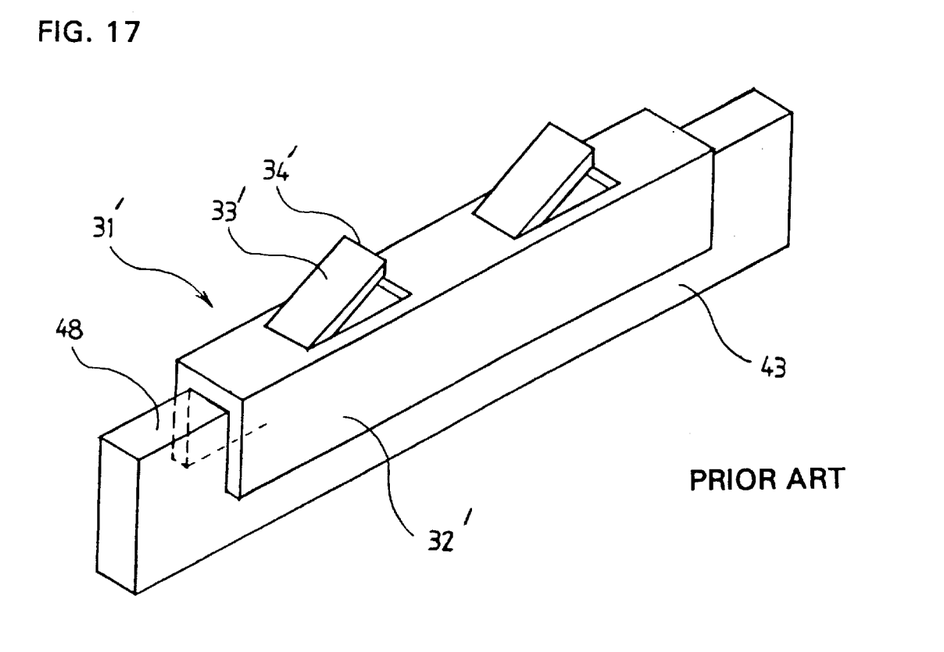
FIG. 17 is a perspective view of the conventional electric connecting terminal of the type shown in FIG. 16.

The connecting terminal 31' assures correct positioning relative to the ground pattern 46, and reliable connection between the ground pattern 46 and the shielded inside 42 and wall 43 of the casing 41. The connecting terminal 31', however, must be designed and made to meet individual size requirements for customized use, and accordingly the cost involved will increase.

SUMMARY OF THE INVENTION

An object of the present invention is to provide a connecting terminal for an electromagnetic shield which is free of the defects described above in that it facilitates exact soldering to the ground pattern of a printed circuit board and permits use with any type or size apparatus.

To attain this object, the present invention comprises a connecting terminal for connecting an electromagnetic shield to a ground pattern formed on a printed circuit board. The connecting terminal comprises an elongated base strip undersurface to be soldered to a selected portion of the ground pattern and a pair of inwardly directed contact arms integrally connected to the opposite ends of the elongated base strip. Each contact arm has a contact for contacting the electromagnetic shield.

The connecting terminal is appropriate for use with a printed circuit board which mounts a high-frequency oscillator. The printed circuit board is contained in a shielded casing having shielding walls to define compartments and a shielded inside. The connecting terminal makes electric connections between the ground pattern, the shielded inside and the shielding walls of the shielded casing, thereby preventing interference of the electromagnetic field produced by the high-frequency oscillator with surrounding electric circuits.

The connecting terminal is improved in that the pair of contact arms are integrally connected to opposite ends of the elongated base strip and are directed inwardly. Preferably, the contact arms are inclined with respect to the base strip and converge toward each other. It is also preferable that the connecting terminal be symmetrically shaped especially with respect to the base strip. Each contact arm makes contact with the shielded inside and shielding walls of the shielded casing.

The center of gravity of the connecting terminal corresponds to the geometric or physical center of the connecting terminal. The elongated base strip of the connecting terminal and, therefore, the connecting terminal can be put in correct position by the self-aligning effect caused by the surface tension of the molten solder while the connecting terminal is soldered to the ground pattern of the printed circuit board. Consequently, the accuracy with which the connecting terminal can be soldered to the ground pattern is substantially improved. The necessary shielding can be effected by soldering a sufficient number of electric connecting terminals to the ground pattern of the printed circuit board.

The connecting terminal may further comprise a shape retainer filled in the space defined by the elongated base strip and the inclined contact arms. A negative pressure may be applied to a generally planar top surface of the elongated base strip or of the shape retainer to suckingly hold the connecting terminal during automatic application of the connecting terminal to the selected portion of the ground pattern. The connecting terminal is generally symmetrical with respect to the planar surface.

Other objects and advantages of the present invention will be better understood from the following description of electric connecting terminals according to preferred embodiments of the present invention.

BRIEF DESCRIPTION OF THE DRAWINGS

The preferred embodiments of the present invention are shown in accompanying drawings.

DETAILED DESCRIPTION OF THE PREFERRED EMBODIMENTS

Figure 1:
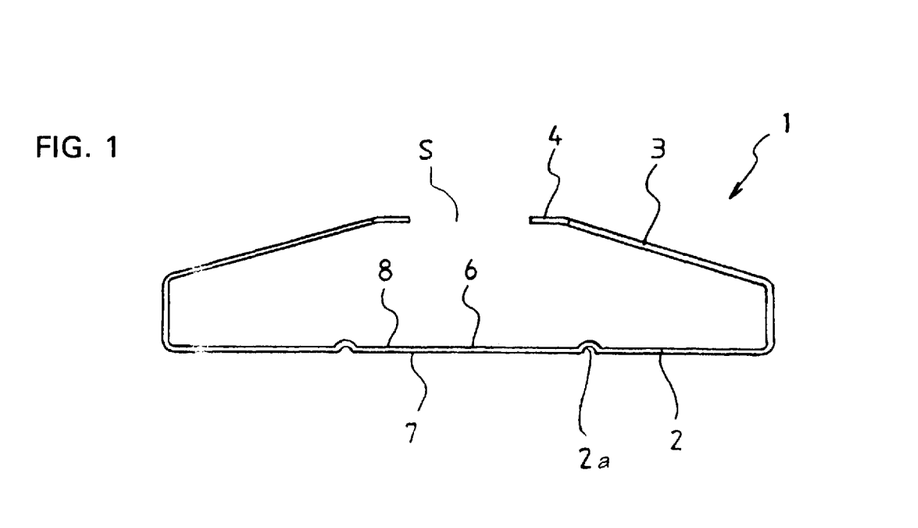
FIG. 1 is a front view of an electric connecting terminal according to a first embodiment of the present invention.
Figure 2:
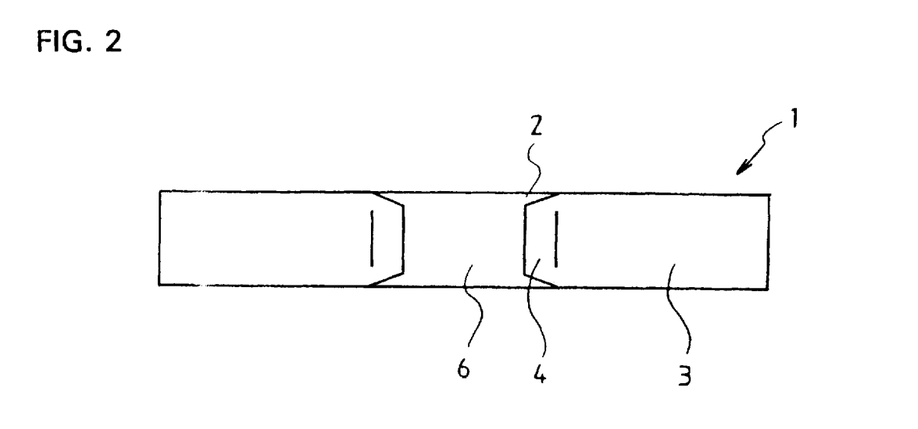
FIG. 2 is a plan view of the electric connecting terminal according to the first embodiment.
Figure 12:
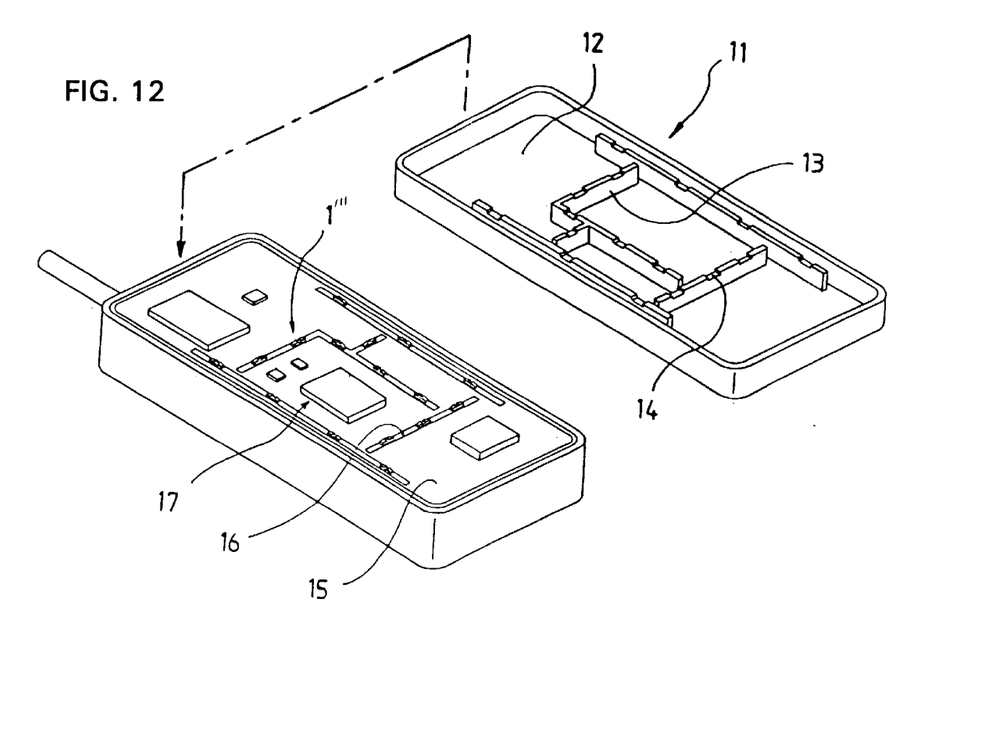
FIG. 12 is a perspective view of a printed circuit board casing in an open condition, showing how electric connecting terminals are used.

FIGS. 1 and 2 show a connecting terminal 1 for an electromagnetic shield according to the first embodiment of the present invention. The connecting terminal is to be used on a printed circuit board 15 having a ground pattern 16 formed thereon as shown in FIG. 12. The connecting terminal 1 is especially useful with a printed circuit board 15 which mounts a high-frequency oscillator 17. The printed circuit board 15 is contained in a shielded casing 11 having a shielded inside 12 and shielded walls 13 to define compartments. The shielding of the inside 12 and the walls 13 is effected by respectively plating the inside and walls of the casing with nickel, copper or other suitable material. The connecting terminal 1 for the electromagnetic shield is designed to make required electric connections between the ground pattern 16, the shielded inside 12 and shielded walls 13 of the casing 11, thereby preventing the electromagnetic field produced by the high-frequency oscillator 17 from interfering with surrounding electric circuits.

The connecting terminal 1 comprises an elongated base strip 2 having an undersurface 7 which is to be soldered to a selected portion of the ground pattern 16. A pair of inwardly directed contact arms 3 are integrally connected to the opposite ends of the elongated base strip 2. Preferably, the shape of the connecting terminal 1 is symmetrical. Most preferably, the connecting terminal is shaped symmetrically with respect to the base strip 2. The pair of contact arms 3 are preferably inclined with respect to the base strip 2 and converge toward each other. Each contact arm 3 has a contact 4 to make contact with the shielded inside 12 and/or shielded walls 13 of the casing 11. The base strip 2 includes dimples 2a. A plurality of connecting terminals 1 are applied as necessary to selected portions of the ground pattern 16 to make sufficient electric connections between the ground pattern 16, the shielded inside 12 and the walls 13 of the casing 11.

The connecting terminal 1 can be sucked and held by applying a negative pressure to the inner surface 8 of the elongated base strip 2 to automatically apply the connecting terminal 1 to a selected portion of the ground pattern 16. A sucking area 6 is generally planar and located at the center of the elongated base strip 2. The generally planar sucking area 6 facilitates the exact positioning and soldering of the connecting terminal 1 to a selected portion of the ground pattern 16. Such exact positioning and soldering is permitted by the self-aligning effect, which is caused by the preferred symmetrical shape of the connecting terminal 1. The connecting terminal 1 is most preferably symmetrical relative to the sucking area 6.

Figure 3:
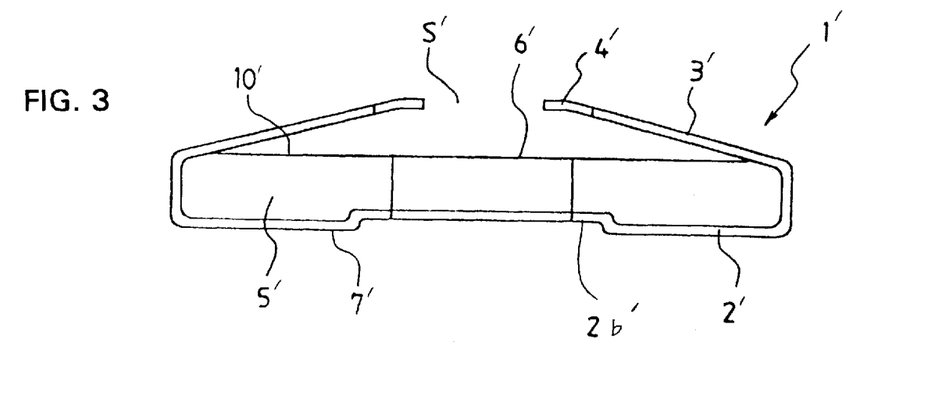
FIG. 3 is a front view of an electric connecting terminal according to a second embodiment of the present invention.
Figure 4:
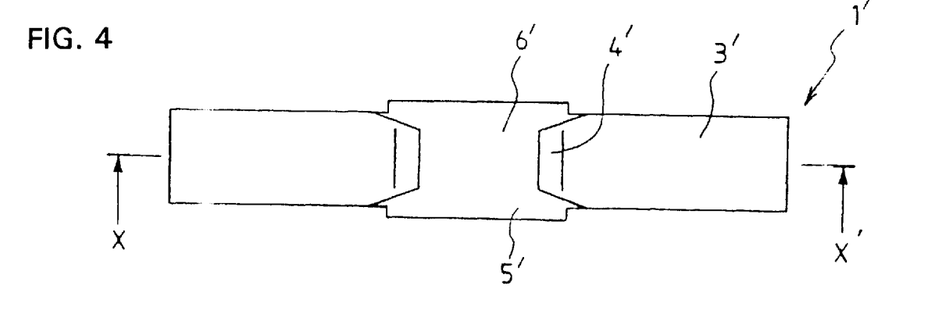
FIG. 4 is a plan view of the electric connecting terminal according to the second embodiment.
Figure 5:
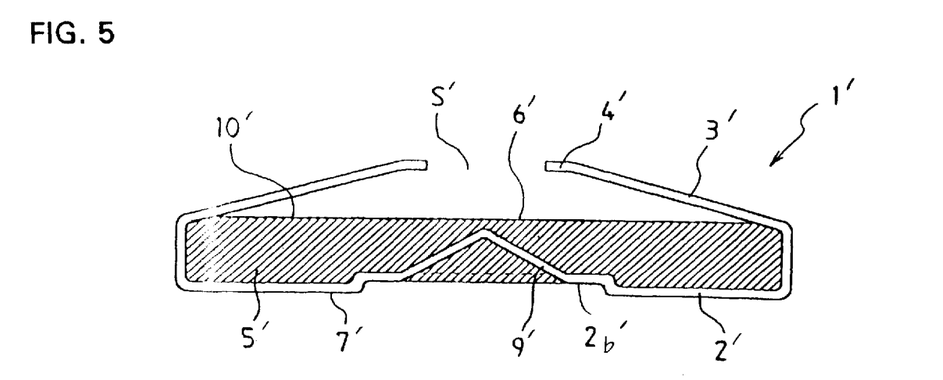
FIG. 5 is a longitudinal section of the electric connecting terminal taken along the line X–X' in FIG. 4.

Referring to FIGS. 3, 4 and 5, an electric connecting terminal 1' according to a second embodiment has a shape retainer 5' filled in the space S' defined by the elongated base strip 2' and the inclined contact arms 3'. The shape retainer 5' prevents the deforming of the contact arms 3' during application of the connecting terminal 1' to ground pattern 16. The connecting terminal 1' can be sucked and held at the generally planar top surface 10' of the shape retainer 5' when sucking nozzle (not shown) applies a negative pressure to surface 10'. Consequently, connecting terminal 1' may be automatically applied to a selected portion of the ground pattern 16.

The shape retainer 5' may be made of nylon, polyalkylene or any other suitable insulating material. The elongated base strip 2' has at least one and preferably a pair of inverted "V"-shaped retainers 9' integrally connected at opposite sides to the base strip 2' for engaging the interior of the shape retainer 5' and holding it in the space S defined by the elongated base strip 2' and the inclined contact arms 3'. As shown in FIG. 5, the retainers 9' are integrally connected to a raised portion 2b' of the base strip.

Figure 6:
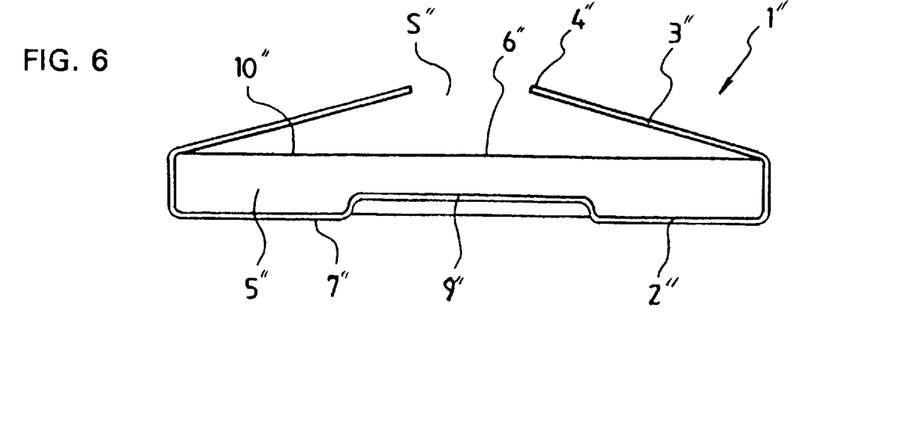
FIG. 6 is a front view of an electric connecting terminal according to a third embodiment of the present invention.
Figure 7:
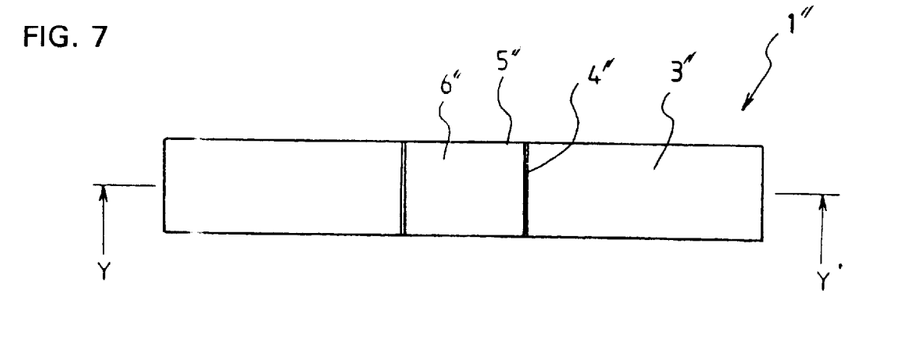
FIG. 7 is a top view of the electric connecting terminal according to the third embodiment.
Figure 8:
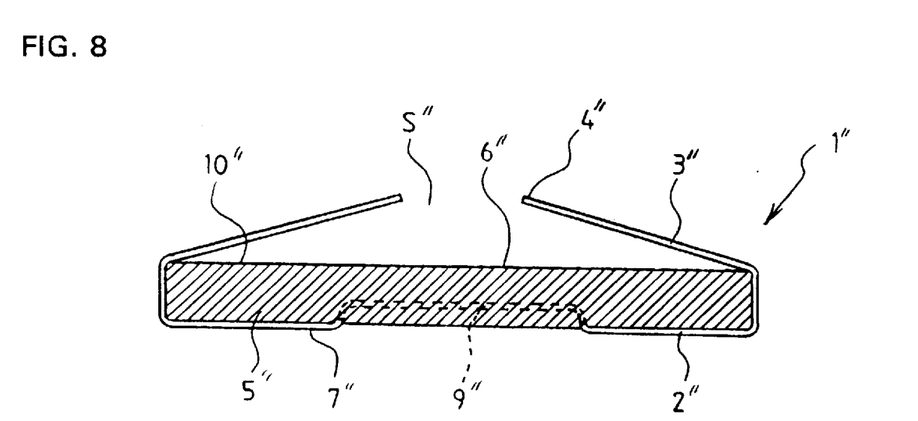
FIG. 8 is a longitudinal section of the electric connecting terminal take along the line Y–Y' in FIG. 7.

Referring to FIGS. 6, 7 and 8, an electric connecting terminal 1" according to a third embodiment is different from the second embodiment of FIGS. 3, 4 and 5 only in that the contact arms 3" extend straight, thus providing unbent contacts 4" at free ends of the contact arms 3". This permits the folding of the contact arms 3" on the top surface 10" of the shape retainer 5" without leaving any remaining space therebetween. This structure reduces the space which the electric terminal 1" occupies. The base strip 2" includes a recess 9".

Figure 9:
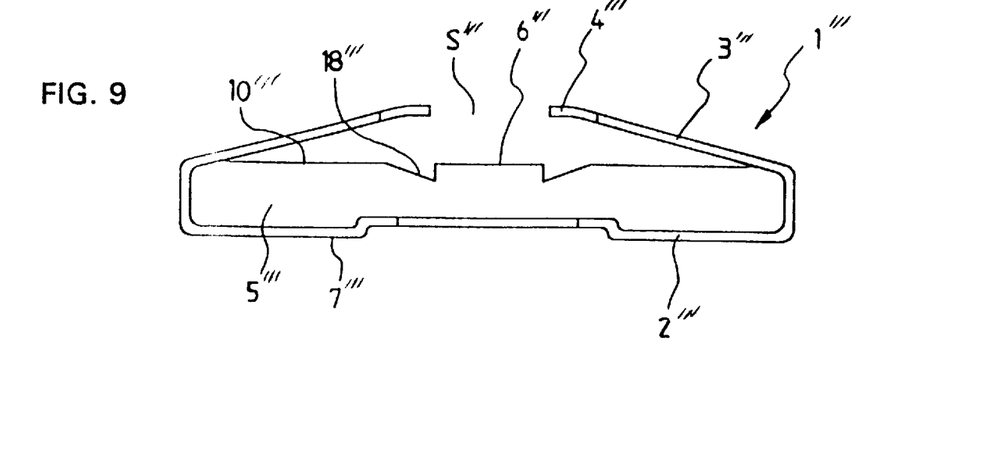
FIG. 9 is a front view of an electric connecting terminal according to a fourth embodiment of the present invention.
Figure 10:
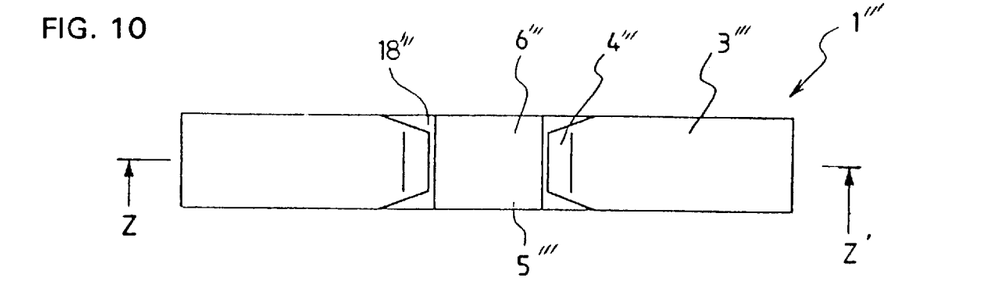
FIG. 10 is a plan view of the electric connecting terminal according to the fourth embodiment.
Figure 11:
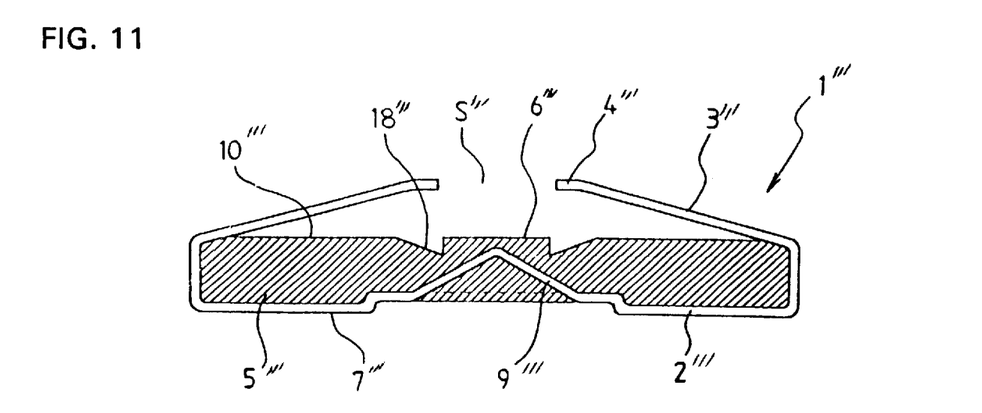
FIG. 11 is a longitudinal section of the electric connecting terminal taken along the line Z–Z' in FIG. 10.

Referring to FIGS. 9, 10 and 11, an electric connecting terminal 1''' according to a fourth embodiment is designed to assure good contact with the shielded inside 12 or shielded walls 13 of the casing and, at the same time, further minimize the remaining space S''' between the contact arms 3''' and the top surface 10''' of the shape retainer 5'''. The connecting terminal 1''' has two inclined contact arms 3''', each having a bent contact 4''' to assure good contact with the shielded inside 12 or shielded walls 13 of the casing 11 due to an enlarge contact area. The shape retainer 5''' has recesses 18''' notched on the top surface 10''', thereby permitting the folding of the contact arms 3''' on the top surface 10''' of the shape retainer 5''' without leaving any space S''' remaining therebetween. This structure of connecting terminals 1''' accordingly reduces the vertical height of the connecting terminal 1''' in use. A generally planar portion 6''' is provided between recesses 18''' for sucking placement purposes.

FIG. 12 shows how the electric connecting terminals 1''' of the present invention can be used. As seen from FIG. 12, the shielding walls 13 have notches 14 intervally spaced from each other. The electric connecting terminals 1''', which are soldered to selected portions of the ground pattern 16, fit in the notches 14 when the cover plate is put on the casing 11, thus shielding surrounding electrical components from the electromagnetic field emitted by the high-frequency oscillator 17.

Figure 13:
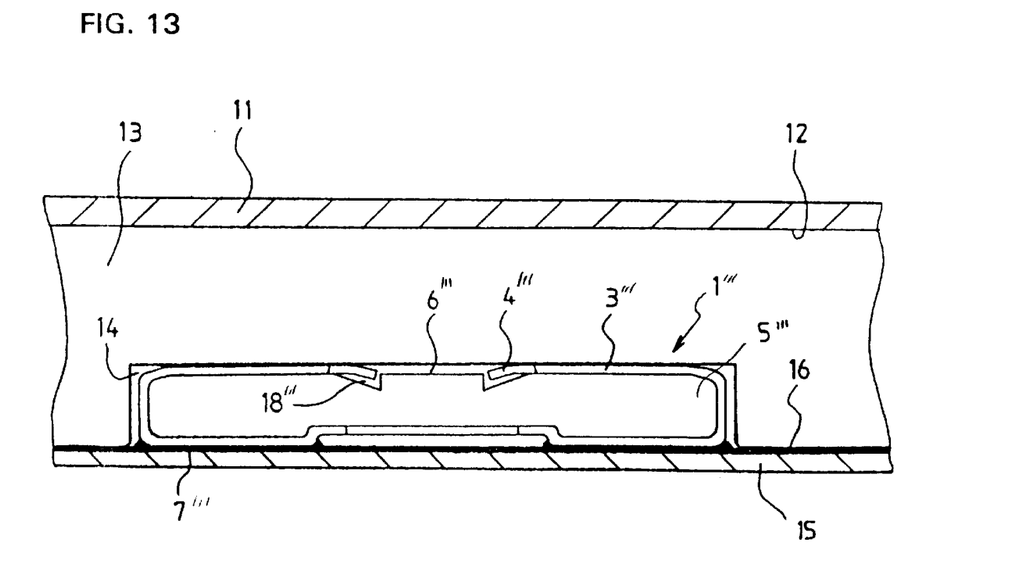
FIG. 13 shows, in section, how the electric connecting terminal is used.

The connection of the connecting terminal 1''' between the ground pattern 16 and the shielded wall 13 is shown in FIG. 13. The invasion of the bent contacts 4''' into the notched recesses 18''' minimizes the space remaining between the ground pattern 16 and the shielded wall 13. The shape retainer 5''' has the effect of keeping the electric connecting terminal 1''' from deforming from its exact, original shape, thereby assuring good contact between the ground pattern 16 and the shielded wall 13.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A connecting terminal for connecting an electromagnetic shield to a ground pattern formed on a printed circuit board comprising an elongated base strip with an undersurface to be soldered to a selected portion of the ground pattern and a pair of inwardly directed contact arms having a first end, and a second end, said first end of each said contact arm being integrally connected to respective opposite ends of the elongated base strip, a tip of said second end of each contact arm being inwardly directed to provide a contact for mechanically and electrically contacting the electromagnetic shield; said terminal further comprising a shape retainer occupying the space defined between the elongated base strip and the contact arms.

2. A connecting terminal according to claim 1 wherein a top surface of the elongated base strip has a generally planar portion to which a negative pressure may be applied to suckingly hold the connecting terminal and apply the connecting terminal to the selected portion of the ground pattern.

3. A connecting terminal according to claim 1 wherein the top surface of a shape retainer has a generally planar portion to which a negative pressure may be applied to suckingly hold the connecting terminal and apply the connecting terminal to a selected portion of the ground pattern.

4. A connecting terminal according to claim 1 wherein said printed circuit board contained in a shielded casing includes shielding walls defining compartments, said connecting terminal being designed to make electric connections between the ground pattern, and the shielding walls of the shielded casing.

5. A connecting terminal according to claim 1 wherein the contact arms converge toward each other.

6. A connecting terminal according to claim 1 wherein the contact arms are inclined.

7. A connecting terminal according to claim 1 wherein the contact arms have an elongated straight portion to minimize the spaced defined between the arms and the base strip.

8. A connecting terminal according to claim 1 wherein the shape retainer has a recess therein for receiving a portion of said contact arms.

9. A connecting terminal according to claim 2 wherein the terminal is symmetrical with respect to the planar portion.

10. A connecting terminal according to claim 4 wherein one of the shielded walls includes a notch for receiving the connecting terminal.

11. A connecting terminal according to claim 1 having a shape which is generally symmetrical.

12. A connecting terminal according to claim 1 which is generally symmetrical with respect to the base strip.

13. A connecting terminal according to claim 3 which is generally symmetrical with respect to the planar portion of the shape retainer.

14. A connecting terminal for connecting an electromagnetic shield to a ground pattern formed on a printed circuit board comprising an elongated base strip with an undersurface to be soldered to a selected portion of the ground pattern; a pair of inwardly directed contact arms integrally connected to opposite ends of the elongated base strip, each contact arm having a contact for contacting the electromagnetic shield and an inwardly directed tip; a shape retainer occupying the space defined between the elongated base strip and the contact arms, a top surface of the shape retainer having an exposed generally planar portion to which a negative pressure may be applied to suckingly hold the connecting terminal and apply the connecting terminal to the selected portion of the ground pattern; and the connecting terminal having a shape generally symmetrical with respect to the planar portion of the base strip.

\* \* \* \* \*